(12) United States Patent
Adkisson et al.

(10) Patent No.: US 9,607,929 B2
(45) Date of Patent: Mar. 28, 2017

(54) TSV WAFER WITH IMPROVED FRACTURE STRENGTH

(71) Applicant: International Business Machines Corporation, Armonk, NY (US)

(72) Inventors: James W. Adkisson, Jericho, VT (US); Yoba Amoah, Fairfax, VT (US); Jeffrey P. Gambino, Westford, VT (US); Christine A. Leggett, Colchester, VT (US); Max L. Lifson, S. Burlington, VT (US); Charles F. Musante, Burlington, VT (US); Sruthi Samala, Bangor, ME (US); David C. Thomas, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/825,778

(22) Filed: Aug. 13, 2015

(65) Prior Publication Data
US 2015/0348876 A1 Dec. 3, 2015

Related U.S. Application Data

(62) Division of application No. 14/195,940, filed on Mar. 4, 2014, now Pat. No. 9,312,205.

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76877* (2013.01); *H01L 21/76898* (2013.01); *H01L 23/53223* (2013.01); *H01L 23/53238* (2013.01); *H01L 23/53266* (2013.01); *H01L 23/562* (2013.01); *H01L 2924/0002* (2013.01)

(58) Field of Classification Search
None
See application file for complete search history.

(56) References Cited

U.S. PATENT DOCUMENTS 6,940,181 B2   9/2005   Derderian et al.
7,871,899 B2   1/2011   Rinne et al.
(Continued)

OTHER PUBLICATIONS

Surrounding. (n.d.) Random House Kernerman Webster's College Dictionary. (2010). Retrieved Nov. 18, 2015 from http://www.thefreedictionary.com/surrounding.*

(Continued)

*Primary Examiner* — Eliseo Ramos Feliciano
*Assistant Examiner* — Mikka Liu
(74) *Attorney, Agent, or Firm* — Gibb & Riley, LLC; Steven J. Meyers

(57) ABSTRACT

A method including forming a through-substrate via through a thickness of a substrate, the thickness of the substrate is measured from a front side of the substrate to a back side of the substrate, removing a first portion of the substrate to form an opening in the back side of the substrate such that a second portion of the substrate remains in direct contact surrounding a vertical sidewall of the through-substrate via, and filling the opening with an alternate material having a lower modulus of elasticity than the substrate.

16 Claims, 11 Drawing Sheets

(51) Int. Cl.
*H01L 21/768* (2006.01)
*H01L 23/532* (2006.01)

(56) References Cited

U.S. PATENT DOCUMENTS

| | | | |
|---|---|---|---|
| 8,193,039 | B2 | 6/2012 | Su et al. |
| 8,466,559 | B2 | 6/2013 | Manepalli et al. |
| 2010/0193954 | A1* | 8/2010 | Liu .................. H01L 21/76898 257/751 |
| 2010/0224966 | A1* | 9/2010 | Chen .................. H01L 23/3121 257/621 |
| 2011/0193197 | A1 | 8/2011 | Farooq et al. |
| 2013/0026599 | A1* | 1/2013 | Nakamura .............. H01L 24/13 257/508 |
| 2013/0093074 | A1* | 4/2013 | Grant ................. H01L 23/3675 257/693 |
| 2013/0140715 | A1 | 6/2013 | Jeng et al. |
| 2013/0154112 | A1* | 6/2013 | Zhang ................ H01L 23/3178 257/774 |
| 2014/0001641 | A1 | 1/2014 | McShane et al. |

OTHER PUBLICATIONS

IBM, "Method to compensate warping of wafers due to stress in thin-film polymers using a counter-stress layer", IPCOM000160818D, Nov. 30, 2007, pp. 1-3.

Sun et al., "Deflection Reduction of GaN Wafer Bowing by Coating or Cutting Grooves in the Substrates", Chin. Phys. Lett. vol. 28, No. 4 (2011) 047303, pp. 047303-1 to 047303-4.

U.S. Appl. No. 14/195,940, Office Action Communication dated Apr. 10, 2015, pp. 1-7.

U.S. Appl. No. 14/195,940, Office Action Communication dated Jul. 1, 2015, pp. 1-19.

U.S. Appl. No. 14/195,940, BUR920130176US1. Office Action Communication dated Jan. 11, 2016. pp. 1-12.

U.S. Appl. No. 14/195,940, BUR920130176US1. Office Action Communication dated Nov. 18, 2015. pp. 1-20.

\* cited by examiner

SECTION A-A

SECTION A-A

SECTION A-A

SECTION A-A

SECTION B-B

SECTION C-C

TSV WAFER WITH IMPROVED FRACTURE STRENGTH

CROSS-REFERENCE TO RELATED APPLICATIONS

The present application claims the benefit under 35 U.S.C. §120 as a divisional of pending U.S. patent application Ser. No. 14/195,940, filed on Mar. 4, 2014, the entire teachings of which are incorporated herein by reference.

BACKGROUND

The present invention generally relates to thin semiconductor wafers, and more particularly to the fracture strength of a thin semiconductor wafer having one or more through-substrate vias.

New integrated circuit technologies include three-dimensional integrated circuits also known as a three-dimensional semiconductor package. One type of 3D semiconductor package can include two or more semiconductor components, for example a chip or a die, stacked vertically and electrically joined with some combination of through-substrate vias and solder bumps. Generally, the through-substrate vias extend through an entire thickness of a substrate or wafer to facilitate the formation of an electrical connection between multiple, stacked, wafers. These through-substrate vias have been known to reduce the mechanical strength of a wafer during fabrication.

SUMMARY

According to an exemplary embodiment, a method is provided. The method may include forming a through-substrate via through a thickness of a substrate, the thickness of the substrate is measured from a front side of the substrate to a back side of the substrate, removing a first portion of the substrate to form an opening in the back side of the substrate such that a second portion of the substrate remains in direct contact surrounding a vertical sidewall of the through-substrate via, and filling the opening with an alternate material having a lower modulus of elasticity than the substrate.

According to another exemplary embodiment, a method is provided. The method may include forming a through-substrate via through a thickness of a single crystal silicon substrate, the through-substrate via extends from a front side of the substrate to a back side of the substrate, and replacing a first portion of the single crystal silicon substrate with an alternate material to improve the durability of the single crystal silicon substrate and reduce the potential for cracking during fabrication, the alternate material has a lower modulus of elasticity than the single crystal silicon substrate, and a second portion of the single crystal silicon substrate remains in direct contact with and surrounds a vertical sidewall of the through-substrate via.

According to another exemplary embodiment, a structure is provided. The structure may include a through-substrate via extending from a front side of a substrate to a back side of the substrate, and a backfill region adjacent to the through-substrate via and extending from the back side of the substrate to a depth within the substrate such that a portion of the substrate is between the backfill region and the through-substrate via, the portion of the substrate is in direct contact with and surrounds a vertical sidewall of the through-substrate via, the backfill region comprises an alternate material having a lower modulus of elasticity than the substrate.

BRIEF DESCRIPTION OF THE DRAWINGS

The following detailed description, given by way of example and not intended to limit the invention solely thereto, will best be appreciated in conjunction with the accompanying drawings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
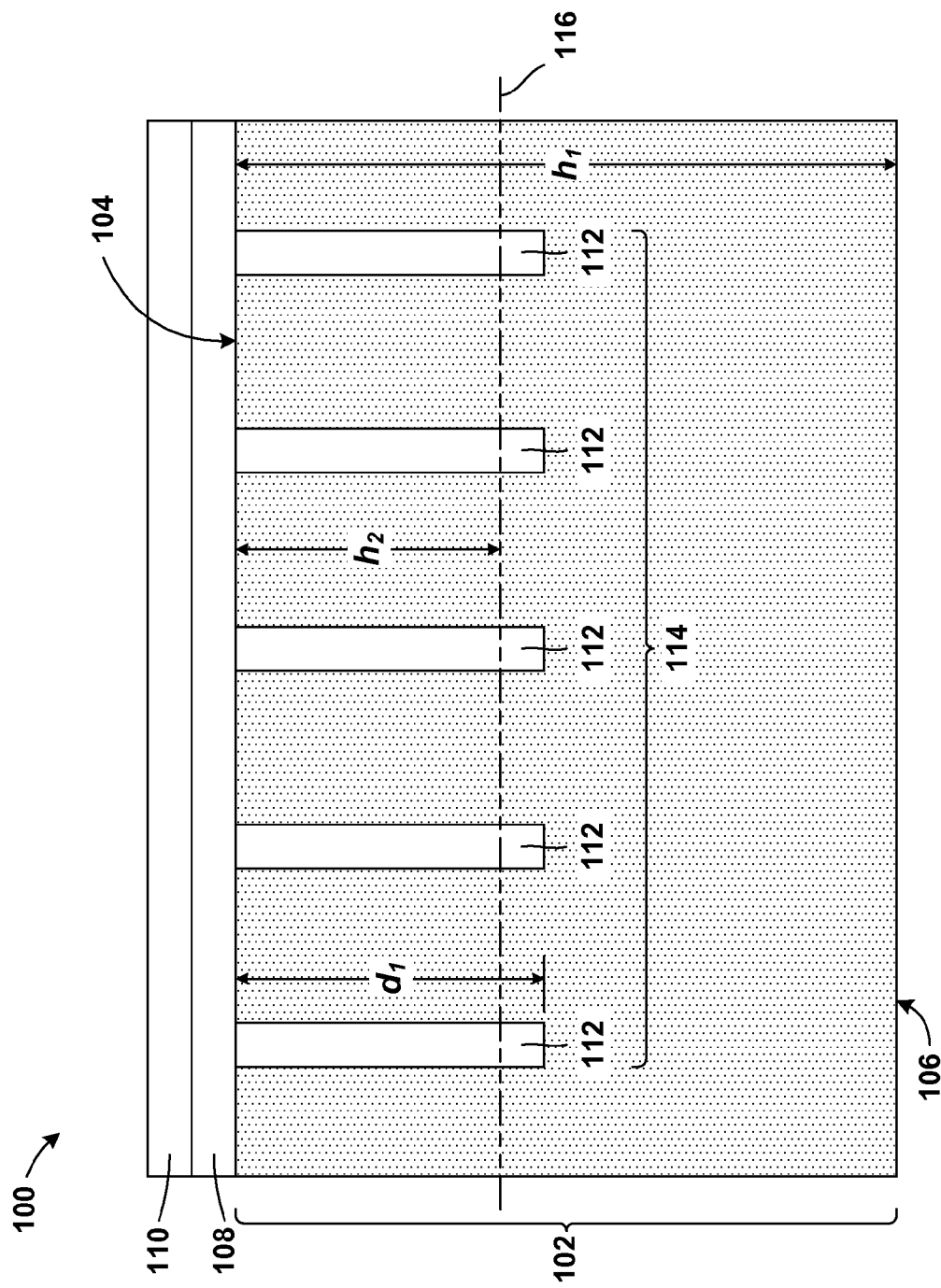
FIG. 1 illustrates a semiconductor structure having a through-substrate via extending partially into a substrate according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to thin semiconductor wafers, and more particularly to the fracture strength of a thin semiconductor wafer having one or more through-substrate vias. The ability to improve the fracture strength of thin semiconductor substrates may improve yield, reliability, and performance. One way to improve the fracture strength of thin semiconductor substrates may include removing some of a single crystal silicon substrate and replacing it with an alternate material. One embodiment by which to fabricate thin semiconductor substrates with through-substrate vias having the improved fracture strength is described in detail below by referring to the accompanying drawings FIGS. 1-13.

FIGS. 1-5 illustrate and describe stages in a fabrication process of a structure 100 in accordance with an embodiment of the invention. Each of the figures is a cross section of a portion of a structure, a semiconductor substrate or semiconductor wafer.

Now referring to FIG. 1, an intermediate step in the fabrication of the structure 100 is shown according to an embodiment. The structure 100 may include a substrate 102 having a front side 104 and a back side 106. It should be noted that the substrate 102 may alternatively be referred to as a wafer. The front side 104 of the substrate 102 may also be referred to as a top side or a device side.

The substrate 102 may include any semiconductor materials well known in the art, such as, for example, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials include gallium arsenide, indium arsenide, and indium phosphide. In an embodiment, the substrate 102 may include a layered configuration such as, for example, silicon-on-insulator (SOI), SiC-on-insulator (SiCOI), or silicon germanium-on-insulator (SGOI). The substrate 102 may be doped or undoped. Also, the substrate 102 may be strained, unstrained or a combination thereof. For purposes of this description, the substrate 102 may include a silicon containing semiconductor material such as a single crystal silicon. Generally, the substrate 102 may be about, but is not limited to, several hundred microns thick. In the present example, the substrate 102 may preferably be thin or very thin and have a thickness ranging from about 200 μm to about 1,000 μm.

In an embodiment, the substrate 102 may have a total thickness ($h_1$) ranging from about 600 μm to about 800 μm, and a desired final thickness ($h_2$) ranging from about 10 μm to about 30 μm. The total thickness ($h_1$) may be measured before performing a backside grinding technique and the desired final thickness ($h_2$) may be measured after performing the backside grinding technique. The desired final thickness ($h_2$) may be indicated in the figures by a reference plane 116.

The structure 100 may also include, a front-end-of-line region 108 (FEOL) followed by a back-end-of-line region 110 (BEOL) fabricated on the front side 104 of the substrate 102. The FEOL region 108 and the BEOL region 110 may include multiple layers and materials. The multiple layers may consist of semiconducting materials, dielectric materials, and conductive materials. The semiconducting materials may include any of those disclosed above with reference to the substrate 102. The dielectric materials may include any of several dielectric materials, for example, oxides, nitrides, and oxynitrides of silicon. The dielectric material may also include oxides, nitrides, and oxynitrides of elements other than silicon. In addition, the dielectric materials may include a crystalline or a non-crystalline dielectric material. The conductive materials may include any of several widely used materials, such as, for example, copper, tungsten, and aluminum.

More specifically, the FEOL region 108 may include active semiconductor devices, such as, for example, diodes, capacitors, or transistors. The BEOL region 110 may include a plurality of metallization features embedded in a plurality of dielectric layers. The metallization features in the BEOL region 110 may include electrical connections to and between the semiconductor devices of the FEOL region 108, such as, for example, a metal line or via.

The structure 100 may further include one or more through-substrate vias 112 (hereinafter referred to as a single "TSV") fabricated within the substrate 102. It should be noted that the TSV 112 may alternatively be referred to as a through-wafer via or TWV. The TSV 112 may generally be fabricated according to known techniques, for example, etching a deep trench into the substrate 102 and subsequently filling the deep trench with an optional liner and a conductive material. More specifically, the deep trench may be formed in the substrate 102 using known patterning techniques, such as for example, a lithography technique followed by an etching technique. The deep trench may intentionally extend beyond the reference plane 116. The term "deep trench" may denote a trench formed in the substrate 102 having a sufficient depth to form a TSV.

In an embodiment, the TSV 112 may generally be fabricated during fabrication of the FEOL region 108. In another embodiment, the TSV 112 may alternatively be fabricated before FEOL processing, after FEOL processing, or even after BEOL processing. The TSV 112 may be made from any conductive material, such as, for example, copper, aluminum, or tungsten. In an embodiment, the TSV 112 may be made from electroplated copper lined with a barrier material, such as, a tantalum/tantalum-nitride liner.

As referenced above, the structure 100 may undergo a subsequent backside grinding technique in which a portion of the back side 106 of the substrate 102 may be recessed or removed up to the reference plane 116 resulting in the substrate 102 having the desired final thickness ($h_2$). Before back side grinding, the TSV 112 may extend from the front side 104 of the substrate 102 to a depth below the reference plane 116, or to a depth greater than the desired final thickness ($h_2$). For example, a TSV in a substrate with a desired final thickness of 30 µm may have a depth ($d_1$) ranging from about 40 µm to about 50 µm. As such, the TSV 112 may have a high aspect ratio, where a height or the depth ($d_1$) of the TSV 112 may be relatively large with respect to a width of the TSV 112. Therefore, the TSV 112 may be tall and thin, and consume less substrate surface area. In an embodiment, the TSV 112 may have a height or depth ($d_1$) ranging from about 10 to about 50 times larger than its width. In an embodiment, the TSV 112 may have a height or depth ($d_1$) ranging from about 30 µm to about 80 µm and a width ranging from about 3 µm to about 50 µm. It will be understood to a person of ordinary skill in the art that the TSV 112 may have one of many cross sectional shapes, including but not limited to, for example, a ring or an annulus, a rectangle, a rounded rectangle, a square, a rounded square, or a circle. It should be noted that the TSV 112 may be fabricated alone or as a single TSV in an array of TSVs. The figures depict an array 114 of TSVs for illustrative purposes only.

The TSV 112 may be used for the fabrication of three-dimensional (3D) integrated circuits in which at least two chips or die are stacked vertically. Vertically stacked chips can reduce interconnect wiring length and increase semiconductor device density. The TSV 112 may provide interconnections and electrical connectivity between the electronic components of the stacked chips. Therefore, as above, the TSV 112 may extend through an entire thickness of a semiconductor substrate (for example the substrate 102). More specifically, the TSV 112 may form an electrical connection from either a semiconductor device in the FEOL region 108 or a metallization feature in the BEOL region 110 to the back side 106 of the substrate 102. Subsequent processing of the back side 106 of the substrate 102 will be discussed in turn below.

Figure 2:
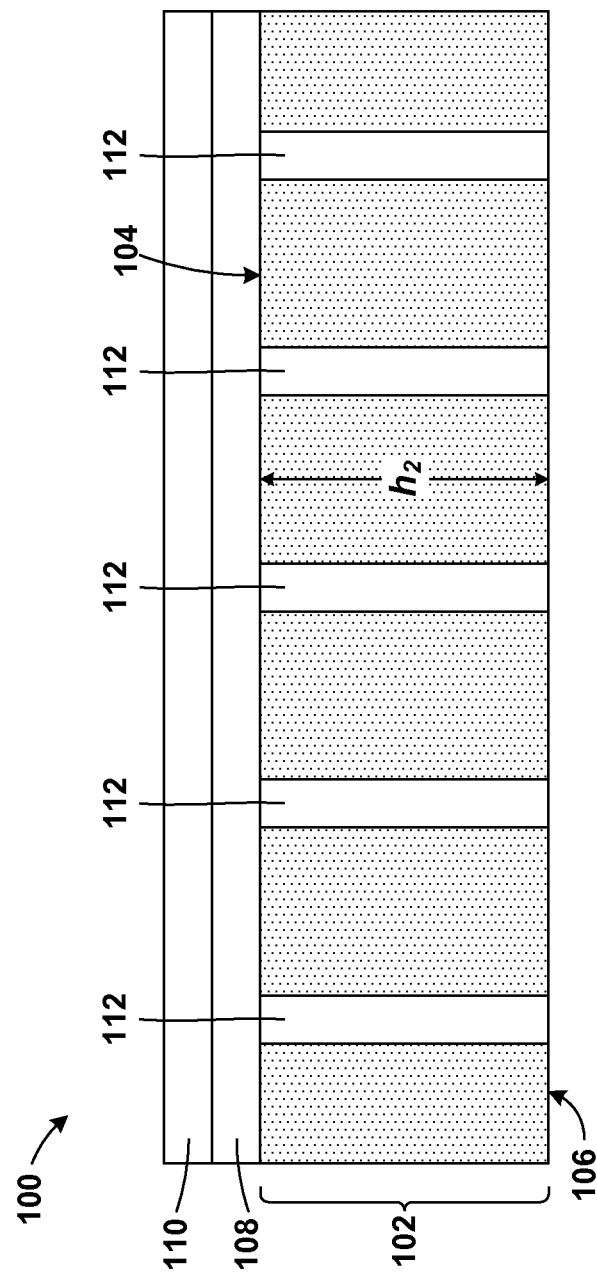
FIG. 2 illustrates a back side grinding technique used to expose a bottom of the through-substrate vias according to an exemplary embodiment.

Referring now to FIG. 2, the thickness of the substrate 102 may be reduced or thinned using a back side grinding technique well known in the art. The chosen back side grinding technique may preferably reduce the thickness of the substrate 102 from the total thickness ($h_1$) (FIG. 1) to the desired final thickness ($h_2$). In addition to reducing the thickness of the substrate 102, the chosen back side grinding technique may be used specifically to expose the TSV 112 on the back side 106 of the substrate 102, among other things. Therefore, the TSV 112 may now, after back side grinding, extend from the front side 104 of the substrate 102 to the back side 106 of the substrate 102. In an embodiment, the back side 106 of the substrate 102 may be recessed using a chemical mechanical polishing technique selective to the conductive material of the TSV 112. In an embodiment, the chosen back side grinding technique may preferably recess or polish both the substrate 102 and the TSV 112. In another embodiment, the chosen back side grinding technique may be selective to the conductive material of the TSV 112. It should be noted that most back side grinding techniques may include multiple steps each varying in the amount of material they are designed to remove. It should also be noted that the structure 100 may be attached or fixed to a substrate support system or handler, as is well known in the art, to facilitate the back side grinding technique.

Figure 3:
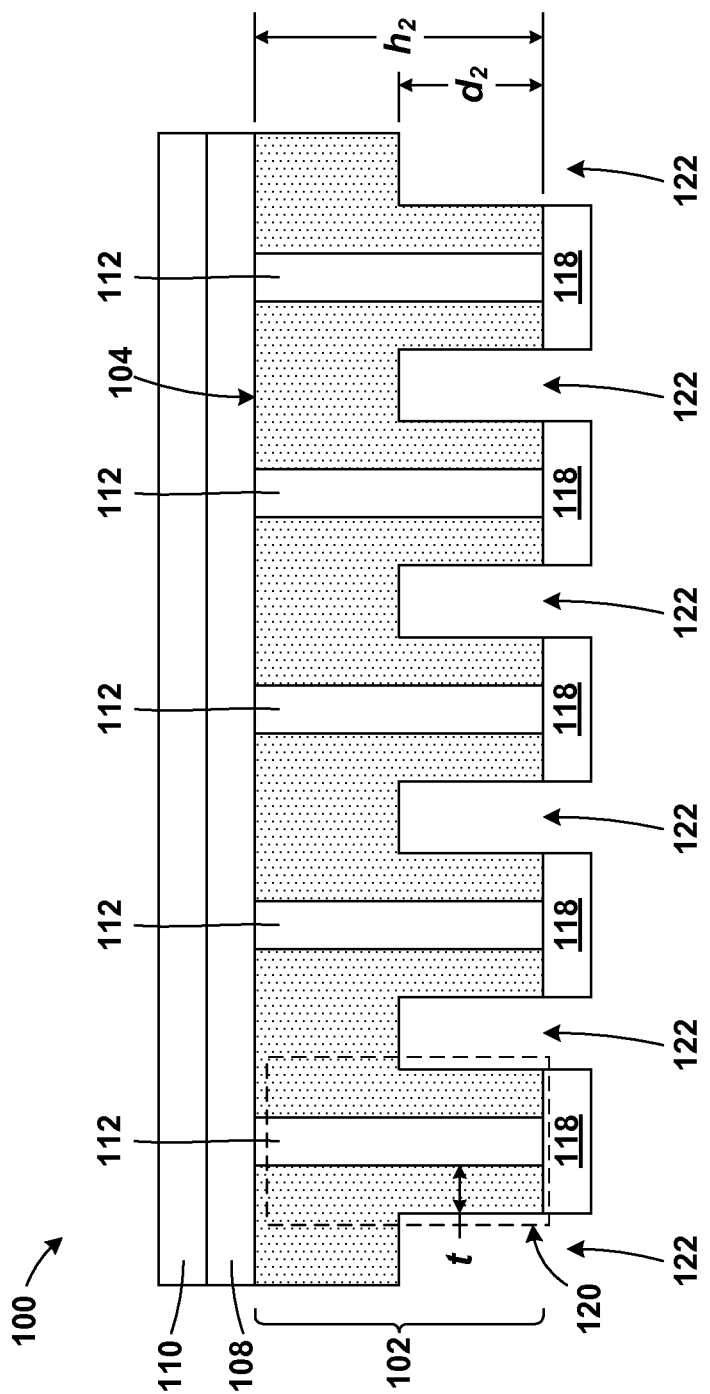
FIG. 3 illustrates patterning a mask on the back side of the wafer immediately above the through-substrate via to protect a first portion of the substrate, and subsequently removing a second portion of the substrate to create an opening according to an exemplary embodiment.

Referring now to FIG. 3, a mask layer 118 may be applied to the back side 106 of the substrate 102, and used to protect the TSV 112 and a first portion 120 of the substrate. More specifically, the mask layer 118 may cover and protect the TSV 112 and the first portion 120 of the substrate 102, while a second portion of the substrate may be recessed or removed to create an opening 122. In the present embodiment, the second portion of the substrate 102 and consequently the opening 122 may be located between two adjacent TSVs 112. Regardless of its location, the opening 122 may include either a relatively small trench, sometimes having a high aspect ratio, or a relatively large trench similar to that used in the formation of an interconnect structure. In all cases, the opening 122 may be situated such that some amount of substrate 102, for example the first portion 120, remains surrounding the entire TSV 112.

The second portion of the substrate 102 may be removed using any suitable non-selective anisotropic etching technique such as dry etch, wet etch, or combination of both. For example, a wet chemical etching technique using a potassium oxide (KOH) based etchant may be used to remove the second portion of the substrate 102. Alternative etch chemistries may include ethylenediamine pyrocatechol (EDP) or hydrazine. The opening 122 created by the removal of the second portion of the substrate 102 may have a depth ($d_2$) approximately equal to half of the desired final thickness ($h_2$).

The mask layer 118 can be a soft mask such as photoresist or a hardmask such as an oxide. In the present example, the mask layer 118 may be patterned such that some amount of the substrate 102 remains surrounding the TSV 112, for example the first portion 120 of the substrate 102. The mask layer 118 may be patterned such that the mask layer 118 may have a cross-sectional area larger than a cross-sectional area of the TSV 112. In an embodiment, the mask layer 118 may have a cross-sectional area at least about 10% to about 200% larger than a cross-sectional area of the TSV 112. It should be noted that the cross-sectional area of the TSV 112 may be measured perpendicular to its height or depth ($d_1$).

In all cases, the mask layer 118 may preferably be patterned such that the TSV 112 remains completely surrounded by the first portion 120 of the substrate 102. The first portion 120 of the substrate 102 may not only surround a perimeter of the TSV 112, but may also remain in direct contact with an entire vertical sidewall of the TSV 112. Stated differently, at this stage of fabrication, the entire TSV 112, except for its ends, remains in direct contact with the substrate 102. The first portion 120 of the substrate 102 may have a lateral thickness (t) extending away from the vertical sidewall of the TSV 112. In an embodiment, the lateral thickness (t) of the first portion 120 of the substrate 102 may be greater than or equal to a width or diameter of the TSV 112. Stated differently, in an embodiment, the first portion of the substrate extends laterally from the vertical sidewall of the TSV 112 by a distance greater than or equal to a diameter or a width of the through-substrate via. In another embodiment, the first portion 120 of the substrate 102 may have a lateral thickness (t) ranging from about 50 µm to about 500 µm and ranges there between.

The first portion 120 of the substrate 102 remaining around the TSV 112 may be designed to provide sufficient structural integrity and mechanical strength, and prevent potential damage to the TSV 112 during subsequent fabrication.

In another embodiment, the mask layer 118 may protect a group or array of TSVs. In such cases, the mask layer may protect a first portion of the substrate surrounding the group or array of TSVs. See also FIGS. 10 and 11 described in detail below.

Figure 4:
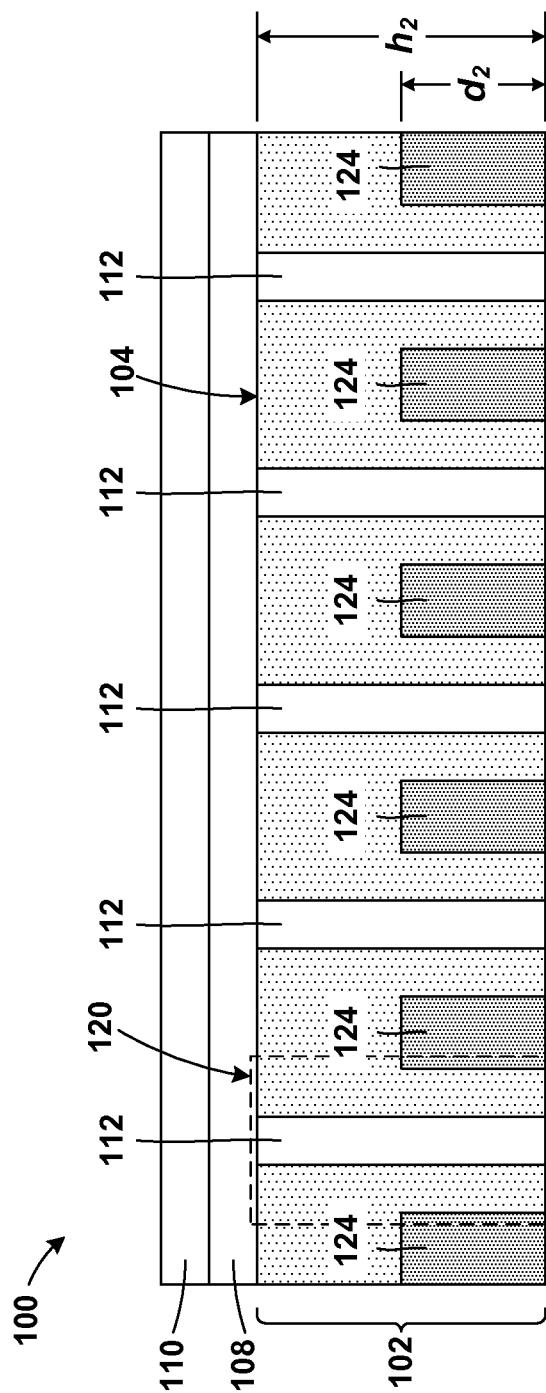
FIG. 4 illustrates depositing an alternate material in the opening according to an exemplary embodiment.

Referring now to FIG. 4, an alternate material 124 may be deposited in the opening 122 to form a backfill region. The alternate material 124 may include any suitable material other than the single crystal silicon of the substrate 102. Suitable materials to be used for the alternate material 124 may include materials that may be deposited within the opening 122 without damaging or compromising the functionality of the structure 100 existing at the time of deposition. Considerations in selecting an appropriate alternate material 124 may include processing characteristics (such as temperatures and techniques), thermal conductance, and elasticity.

In all cases, the alternate material 124 may preferably be deposited in the opening 122 using a technique in which the process temperature is equal to or less than approximately 400° C. to ensure that no damage, electrical or physical, occurs to the functional devices and circuits of the structure 100. For example, if a substrate support system or handler is temporarily bonded to the structure 100 using an adhesive, then consideration must be given to the operating temperatures of the adhesive. More specifically, the maximum process temperature may not exceed the maximum allowed process temperature of the chosen adhesive. Adhesive formulations and therefore maximum allowed process temperatures can vary. For example, a typical maximum process temperature for polymer adhesives may range from approximately 250° C. to approximately 300° C. Therefore, the maximum process temperature for depositing the alternate material 124 may depend on surrounding elements of the structure 100 present at the time of deposition. Additionally, ease of depositing the chosen material in small, high aspect ratio trenches may be considered.

The alternate material 124 may preferably be at least as thermally conductive as the substrate 102 to enable adequate cooling of the functional devices and circuits during operation. The alternate material 124 may preferably have different stress-strain characteristics than the substrate 102. Generally, the alternate material 124 may be more ductile or more malleable than the substrate 102, and as such the alternate material 124 may be more resistant to cracking or fracturing than the substrate 102 under similar loading conditions. The alternate material 124 may, in some embodiments, have a higher fracture strength or a higher ultimate tensile strength than the substrate 102. Stated differently, the alternate material 124 may be capable of undergoing higher stresses without cracking or fracturing. In an embodiment, the alternate material may have a higher yield point or yield strength than the substrate 102. Alternatively, the alternate material 124 may be capable to withstand a higher maximum stress than the substrate 102 while being stretched or pulled before failing or breaking. Lastly, the alternate material 124 may preferably have a lower modulus of elasticity, or otherwise referred to as Young's modulus, than the substrate 102. In other words, the alternate material 124 may be more elastic than, and not as stiff as, the substrate 102.

In an embodiment, the alternate material 124 may include, for example, an amorphous, polycrystalline material, or some combination thereof. Examples of materials to be used for the alternate material 124 may include, but are not limited to, amorphous silicon, amorphous germanium, aerogel, various polymers, metals (for example aluminum), molding compound, or some combination thereof. Additional possible materials are contemplated.

The alternate material 124 can be deposited using any suitable deposition technique known in the art. In an embodiment, the alternate material 124 may be deposited with a conformal deposition technique such as chemical vapor deposition (CVD) or plasma enhanced CVD (PECVD). In an embodiment, the alternate material 124 may include amorphous silicon deposited using a chemical vapor deposition technique. Another viable and cost effective material would be a conductive polymer, for example, molding compound. In the present embodiment, the opening 122 (FIG. 3) may preferably be etched and subsequently filled with the alternate material 124 after all front side processing has occurred.

After depositing the alternate material 124 on the back side 106 of the substrate 102 and within the opening 122 (FIG. 3), a polishing technique may be used to remove any excess or overburden material remaining outside the opening 122. The polishing technique may prepare the back side 106 of the substrate 102 for subsequent processing. More specifically, the polishing technique may remove the overburden material to expose the ends of the TSV 112, and allow for an electrical connection to be subsequently formed as described in detail below with reference to FIG. 5. For example, a chemical mechanical polishing (CMP) technique may be used to polish the back side 106 of the substrate 102 and remove any excess or overburden material such that a bottom surface (as oriented in the figures) of the alternate material 124 is substantially flush with the back side 106 of the substrate 102. After polishing, the TSV 112 may preferably be exposed in preparation for subsequently forming an electrical connection. Other techniques for removing the overburden material may be used, such as a blanket (unpatterned) etch.

Filling the opening 122 with the alternate material 124 may be designed to improve the structural properties of the structure 100 and more specifically improve the strength of the substrate 102. In general, substrate structures with TSVs are prone to cracking and fracturing during the fabrication process. Cracks and fractures in the substrate may negatively affect functionality and performance of the final structure. Currently time consuming quality control procedures are used to detect such cracks and fractures. Ultimately, production yield may be detrimentally affected by both defective products and production delay caused by the time consuming detection measures.

Replacing the second portion of the substrate 102 with the alternate material 124 may optimally reduce the potential for stress fractures and increase the overall durability of the structure 100. Increasing durability may prove to increase yield by lowering the potential for cracking or fracturing common during fabrication of thin substrates having through-substrate vias. For example, substituting a portion of a single crystal substrate, for example the substrate 102, with an alternate material, for example the alternate material 124, can eliminate or reduce the potential for cracking and fracturing of the substrate by introducing a material or materials that are less likely to crack under typical flexing of the finished substrate or wafer.

Cracks may propagate more easily along crystal planes of single crystal materials. Integrating alternate non-single crystal materials, such as, for example amorphous materials or polycrystalline materials, may significantly reduce the probability of cracking or fracturing in the substrate. Moreover, integrating non-single crystal materials with single crystal materials may effectively limit the length of cracks that do occur and may limit further propagation of those cracks. Limiting the length of potential cracks and limiting their propagation across a substrate may improve yield by limiting the number of individual die affected by the cracks. Integrating the alternate material 124 into the back side 106 of the substrate 102 can also effectively equalize the net stress in the structure 100, or counteract stresses on the structure 100 cause by the BEOL region.

Figure 5:
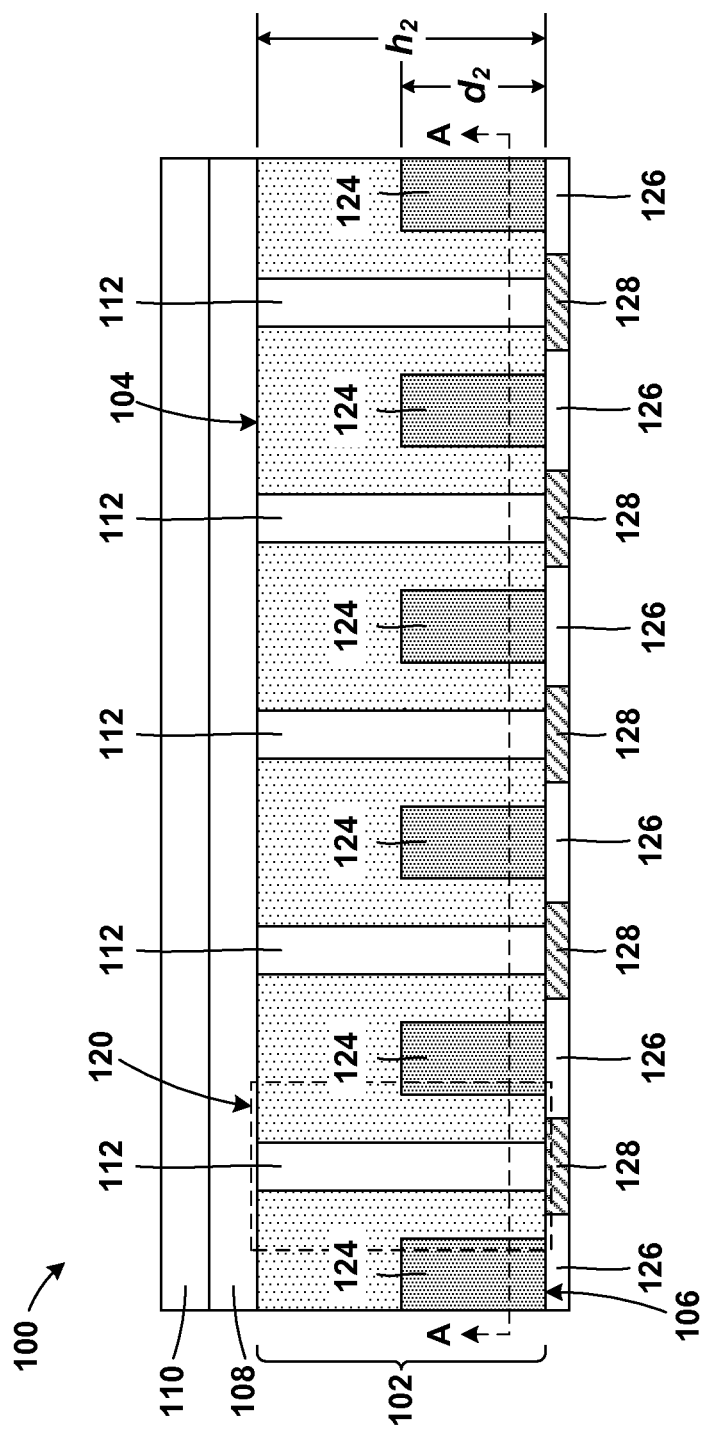
FIG. 5 illustrates a final structure according to an exemplary embodiment.

Now referring to FIG. 5, a final step in the fabrication of the structure 100 is shown according to an embodiment. In this step, a hardmask 126 may be deposited and patterned on the back side 106 of the substrate 102, followed by the formation of a back side contact 128. First, the hardmask 126 may be deposited on the back side 106 of the substrate 102. The hardmask 126 may include any suitable hardmask known in the art deposited using known techniques. Suitable materials to be used for the hardmask 126 may include materials that can be patterned to only expose regions of the structure 100 aligned with the TSV 112 without damaging or compromising the functionality of the structure 100 existing at the time of deposition and patterning. For example the hardmask 126 may include, but is not limited to, silicon nitride, silicon oxide, silicon oxynitride, Si—C, or other available dielectrics.

After being deposited, the hardmask 126 may be patterned to form a contact opening (not shown). The hardmask 126 may be patterned using lithography techniques well known in the art. The contact opening may preferably be aligned with and expose the TSV 112 on the back side 106 of the substrate 102. In the present example, the hardmask 126 may remain, and the contact opening may then be filled with any suitable conductive material known in the art suitable to form the back side contact 128. The back side contact 128 may be fabricated using techniques and materials well known in the art. For example, the back side contact 128 may include copper deposited in the contact opening using an electro-deposition technique. The back side contact 128 may be fabricated in preparation for subsequent back side processing, including, but no limited to, back side wiring, or solder bumps. In all cases, the back side contact 128 may be in direct contact with the TSV 112.

In an embodiment, for example, a solder bump (not shown) may be formed on the back side contact 128 in preparation for a flip chip connection to an adjoining structure. The solder bump may be formed adjacent to and indirect contact with the back side contact 128. Alternatively, the solder bump may be fabricated on the adjoining structure. In another embodiment, for example, one or more back side wiring layers (not shown) may be fabricated corresponding to and forming an electrical connection with the back side contact 128.

In an embodiment, a back side dielectric may be used in place of the hardmask 126. In such embodiments, the back side dielectric layer may be deposited on the back side 106 of the substrate 102 and then patterned to form the contact opening, similar to the hardmask 126 described above. The back side dielectric may include any dielectric material suitable for electrically isolating multiple wiring layers from one another. The back side dielectric may be substantially similar to the dielectric material used in the BEOL region 110 described above. In some cases, dielectric layers used in both the BEOL region 110 and the back side wiring may be referred to as an inter-level dielectric.

It should be noted that the while a back side contact 128 is illustrated in the figures and described above as an embodiment, any back side processing known in the art may be carried out subsequent to replacing the second portion of the substrate 102 with the alternate material 124.

Figure 6:
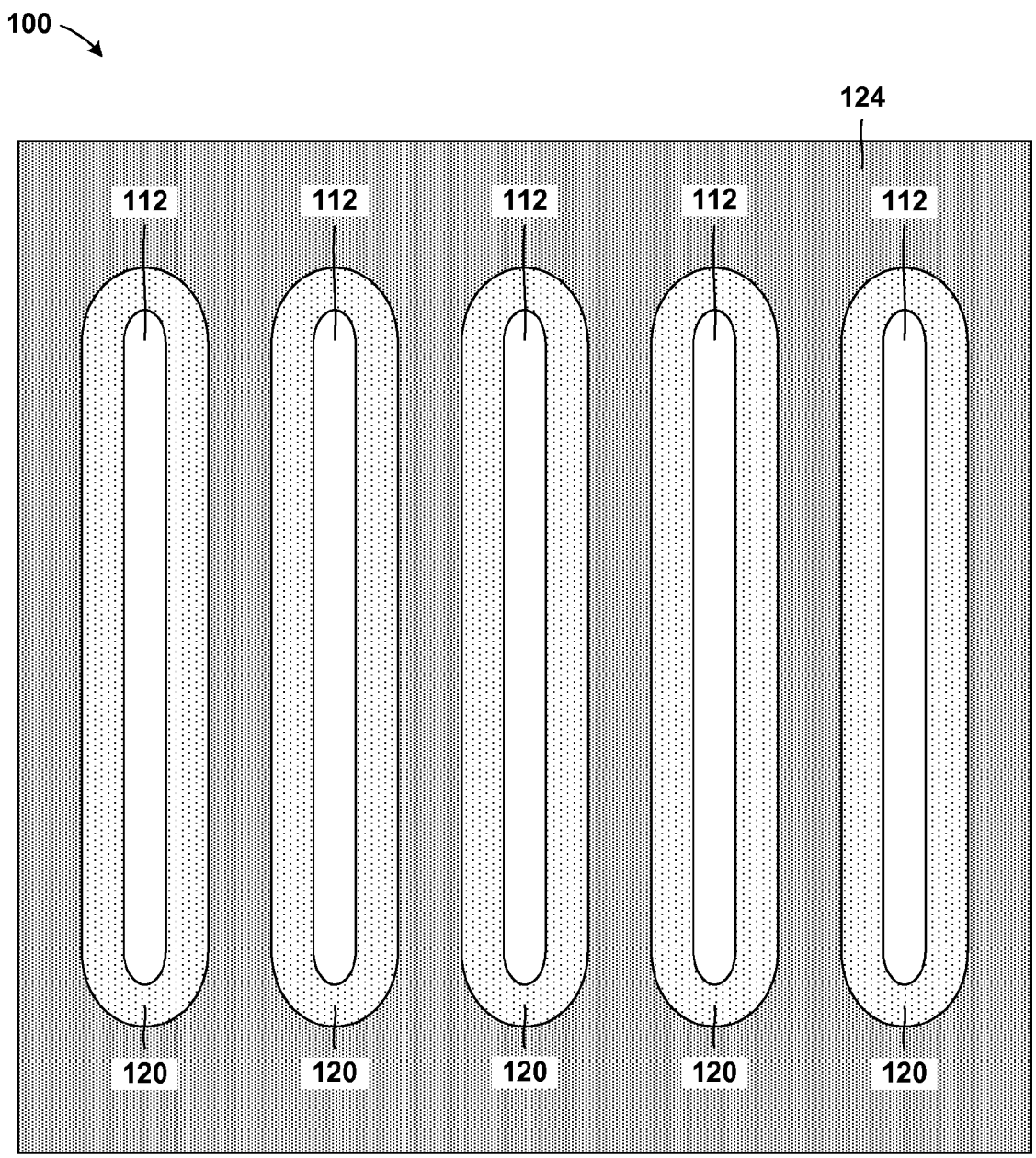
FIG. 6 is a cross section view of FIG. 5 along section line A-A according to an exemplary embodiment.

Referring now to FIG. 6, a cross section view of FIG. 5, along section line A-A, is shown according to an embodiment. In the present embodiment, as illustrated in the figure, the TSV 112 may have a rounded rectangular cross sectional shape, or may alternatively be referred to as a via bar. In the present embodiment, the first portion 120 of the substrate 102 surrounds the entire perimeter of the TSV 112. The first portion 120 of the substrate 102 surrounding the TSV 112 may alternatively be referred to as a silicon collar, in cases where the substrate 102 is in fact silicon.

Figure 7:
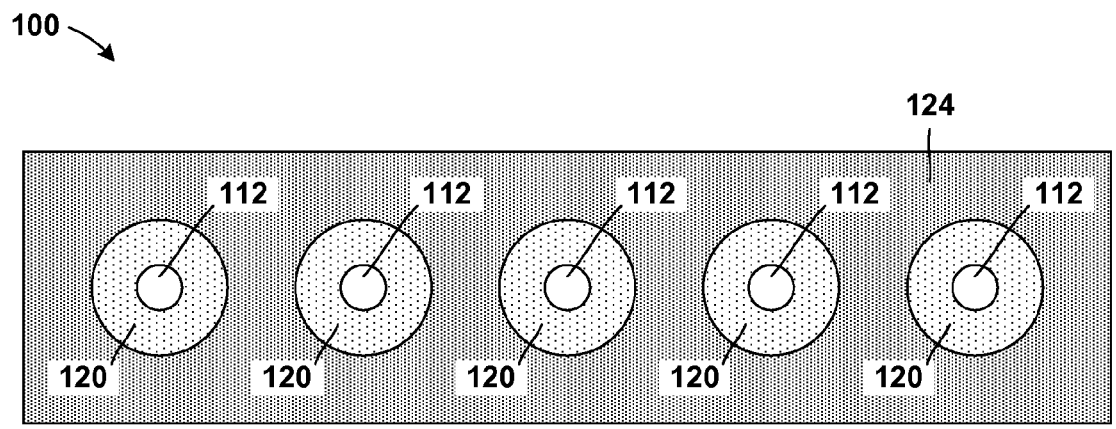
FIG. 7 is a cross section view of FIG. 5 along section line A-A according to another exemplary embodiment.

Referring now to FIG. 7, a cross section view of FIG. 5, along section line A-A, is shown according to an alternative embodiment. In the present embodiment, as illustrated in the figure, the TSV 112 may have a circular cross sectional shape. As described above, the first portion 120 of the substrate 102 surrounds the entire perimeter of the TSV 112.

Figure 8:
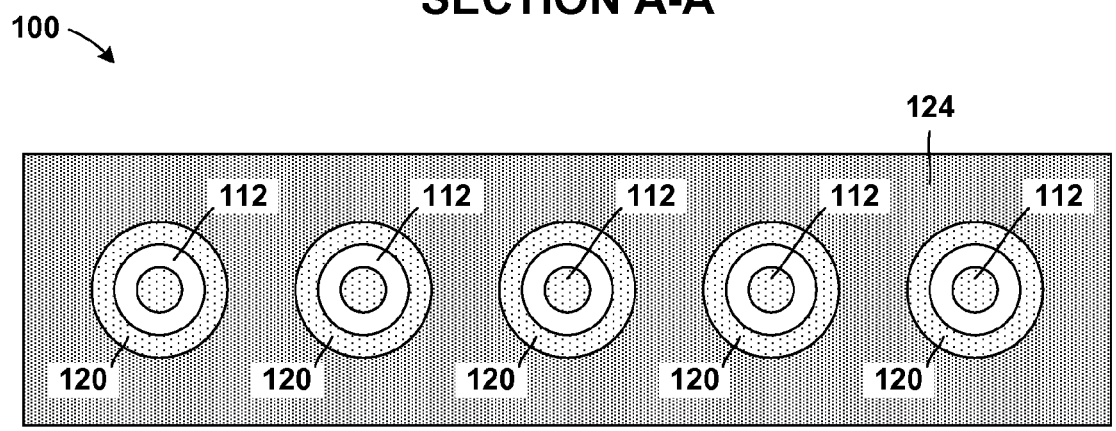
FIG. 8 is a cross section view of FIG. 5 along section line A-A according to another exemplary embodiment.

Referring now to FIG. 8, a cross section view of FIG. 5, along section line A-A, is shown according to an alternative embodiment. In the present embodiment, as illustrated in the figure, the TSV 112 may have an annular cross sectional shape, in which the TSV 112 may have an interior vertical wall and an exterior vertical wall, each completely surrounded by the substrate 102.

Figure 9:
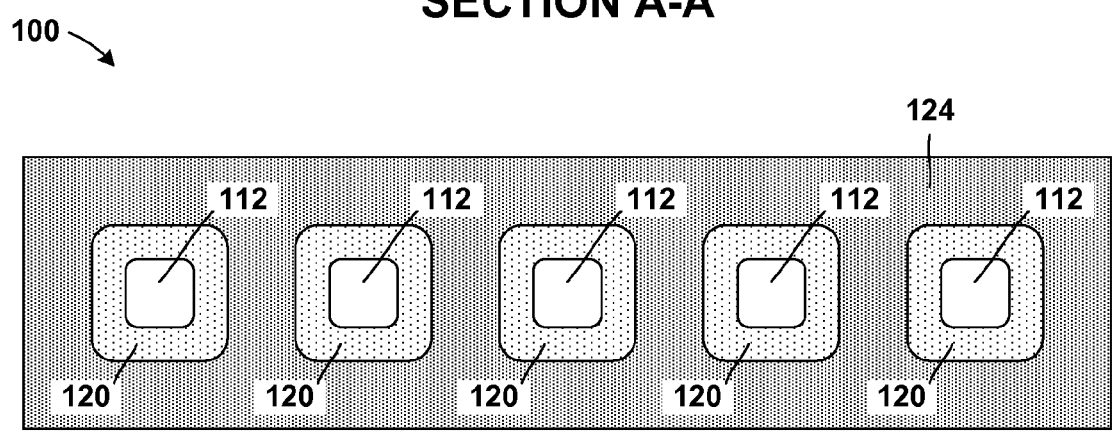
FIG. 9 is a cross section view of FIG. 5 along section line A-A according to another exemplary embodiment.

Referring now to FIG. 9, a cross section view of FIG. 5, along section line A-A, is shown according to an alternative embodiment. In the present embodiment, as illustrated in the figure, the TSV 112 may have a rounded square cross sectional shape. Again, as described above, the first portion 120 of the substrate 102 surrounds the entire perimeter of the TSV 112.

Figure 10:
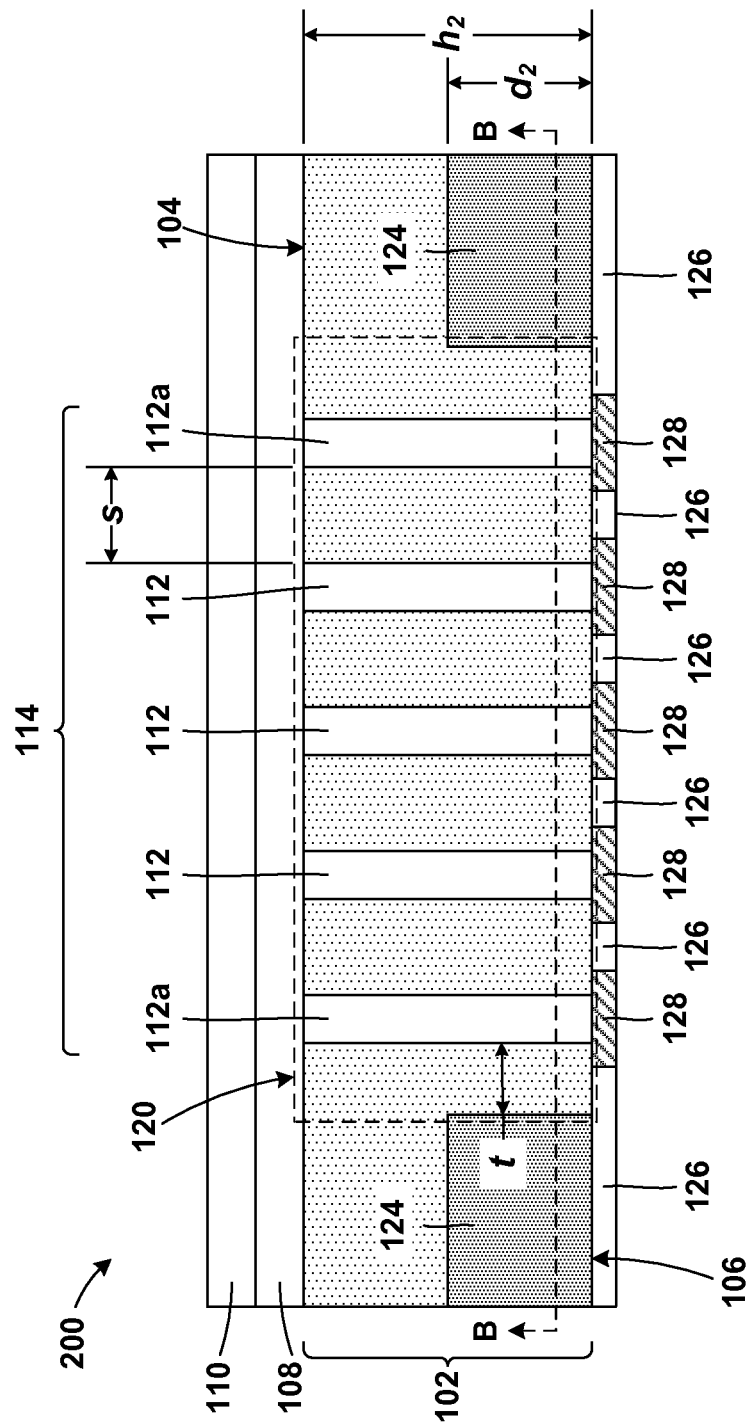
FIG. 10 illustrates the final structure according to another exemplary embodiment.
Figure 11:
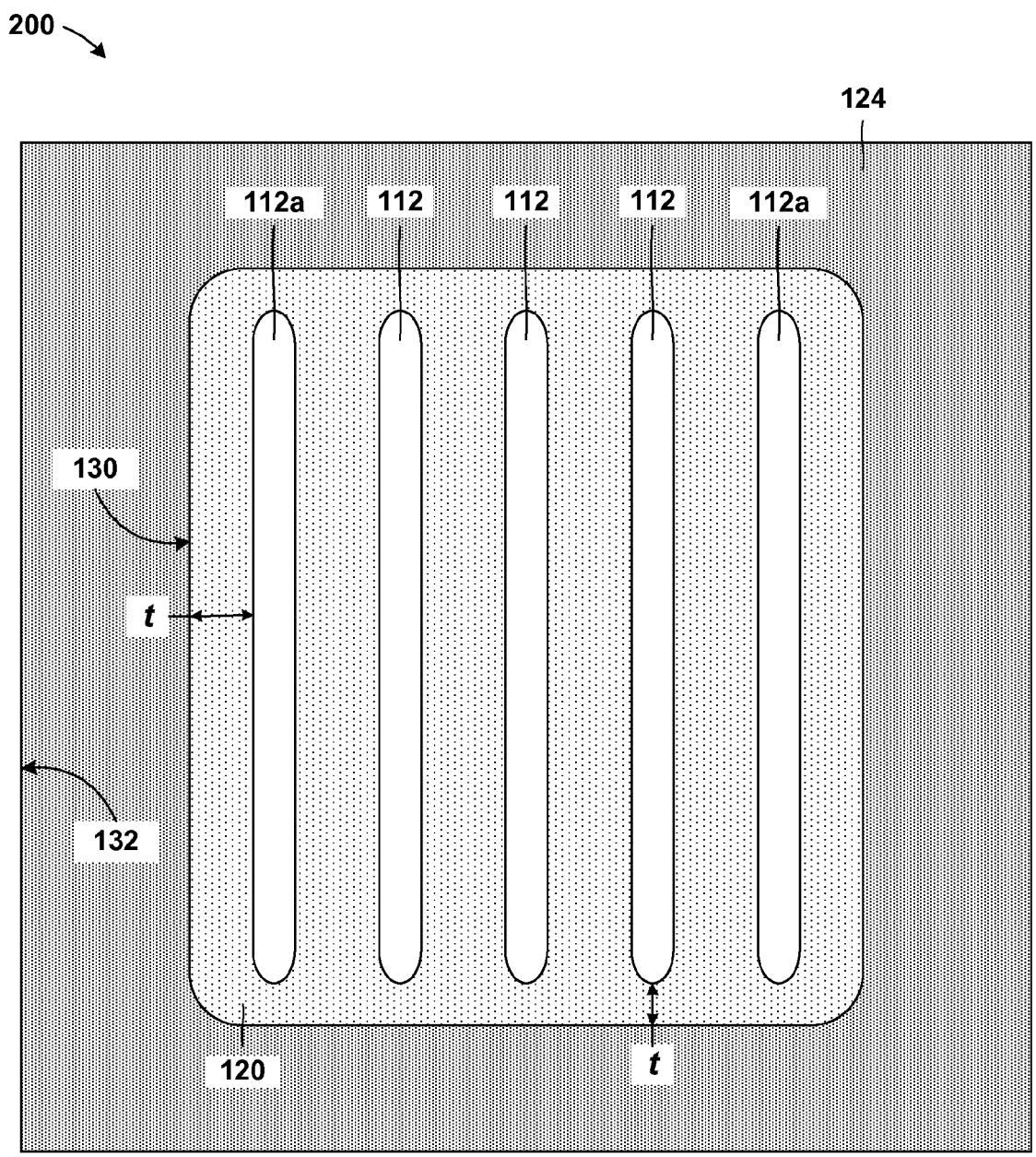
FIG. 11 is a cross section view of FIG. 10 along section line B-B according to an exemplary embodiment.

Now referring to FIGS. 10 and 11, a final structure 200 is shown according to an alternative embodiment. FIG. 10 is a cross section of a portion of the structure 200, and FIG. 11, is a cross section view of FIG. 10, along section line B-B. In the present embodiment, the one or more TSVs 112 may be fabricated in the substrate 102 with a tight pitch, or spaced very close to one another. For purposes of this description a tight pitch or very close spacing may indicate that a space (s) between two adjacent TSVs 112 may be less than twice the desired lateral thickness (t) of the first portion 120 of the substrate 102. If the space (s) is less than twice the desired lateral thickness (t) of the first portion 120 of the substrate 102, then the design may not allow for a portion of the substrate 102 (for example, the second portion of the substrate 102) to be removed from between two adjacent TSVs 112. In such cases, an opening (not shown) may be formed around the group or the array 114 of TSVs 112. As described above, the opening would then be filled with the alternate material 124. In the present example, the array 114 of TSVs 112 may dictate an interior boundary 130 of the alternate material 124; however an exterior boundary 132 of the alternate material 124 may not be limited to any size, shape, or location. More specifically, the first portion 120 of the substrate 102 may have a lateral thickness (t), as described above, extending away from a vertical sidewall of an outermost TSV 112a. The first portion 120 of the substrate 102 may also have a lateral thickness (t), as described above, extending away from one end of the TSV 112.

Figure 12:
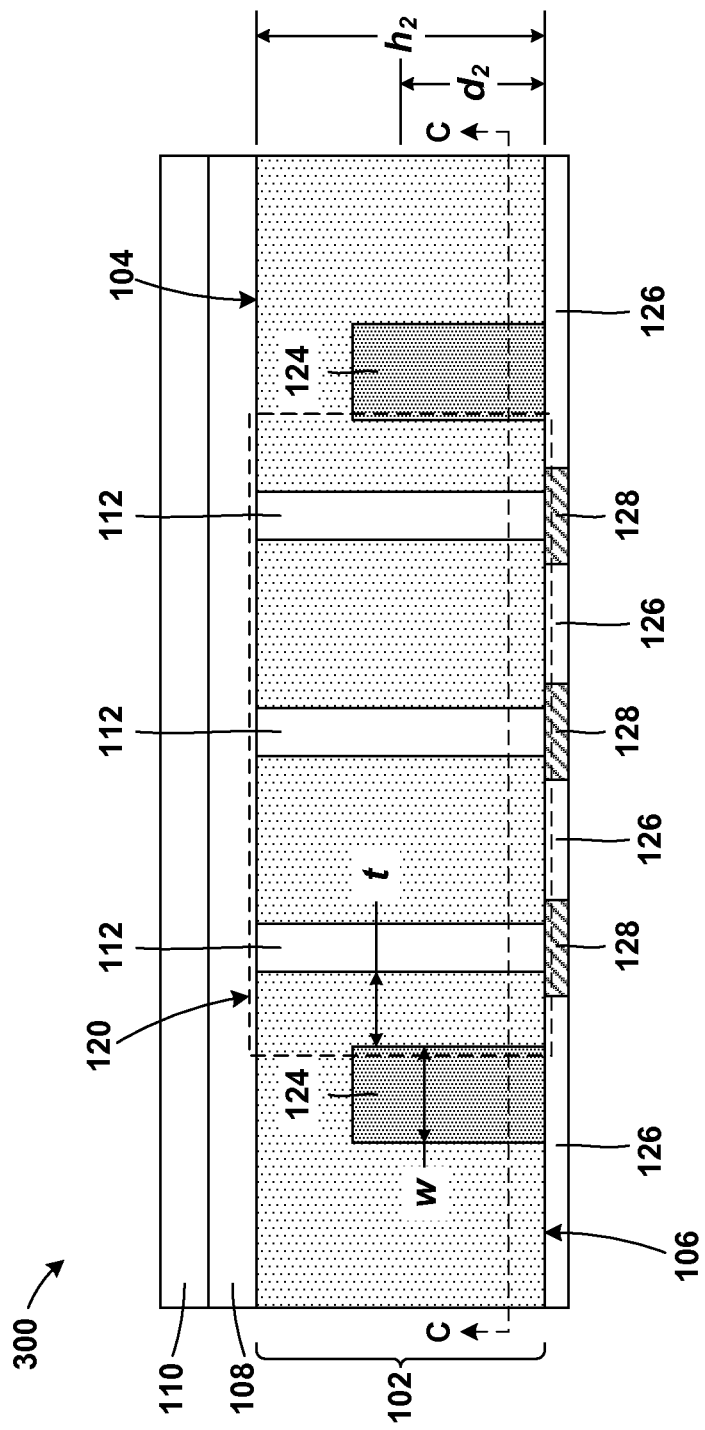
FIG. 12 illustrates the final structure according to another exemplary embodiment.
Figure 13:
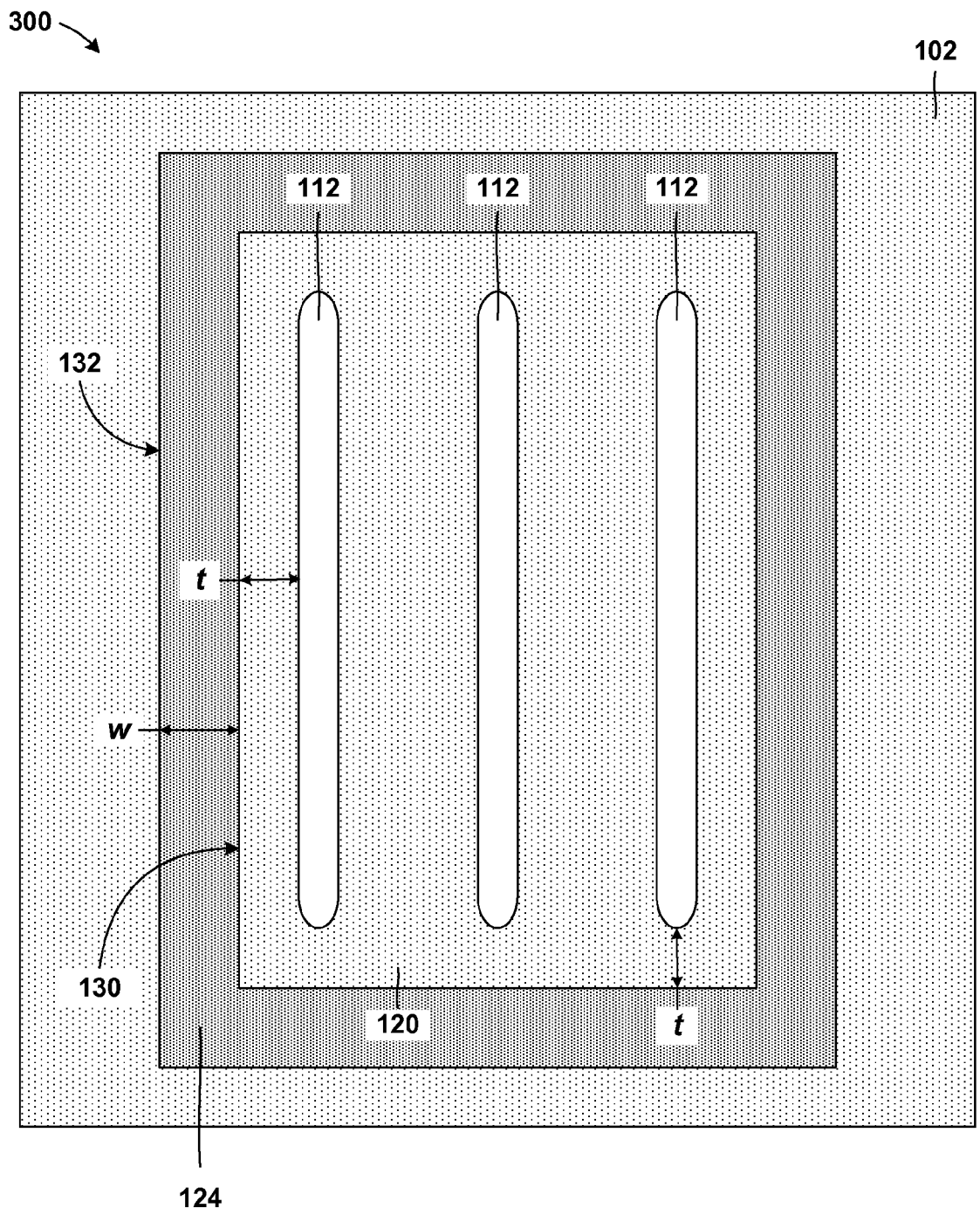
FIG. 13 is a cross section view of FIG. 12 along section line C-C according to an exemplary embodiment.

Now referring to FIGS. 12 and 13, a final structure 300 is shown according to an alternative embodiment. FIG. 12 is a cross section of a portion of the structure 300, and FIG. 13, is a cross section view of FIG. 12, along section line C-C. In the present embodiment, the one or more TSVs 112 may be fabricated in the substrate 102 as a group or array according to known techniques with no particular spacing.

Like above, an opening (not shown) may be formed around the group or the array 114 of TSVs 112, and subsequently filled with the alternate material 124. Like above, the first portion 120 of the substrate 102 may have a lateral thickness (t), as described above, extending away from a vertical sidewall of an outermost TSV 112. The first portion 120 of the substrate 102 may also have a lateral thickness (t), as described above, extending away from on end of the TSV 112. In the present example, the array 114 of TSVs 112 may dictate an interior boundary 130 of the alternate material 124; however an exterior boundary 132 of the alternate material 24 may be offset from the interior boundary 130 by a width (w). The width (w) of the alternate material 124 may range from about (t)+50 µm to about (t)+500 µm. In addition to improving the strength of the structure 100, the alternate material 124 of the present example may also function as a crackstop and isolate cracks originating at the TSV 112 from propagating across an entire substrate. In the present example, a crack originating from one of the TSVs 112 may be confined within the first portion 120 of the substrate 102 surrounded by the alternate material 124. In an embodiment, a metal contact or any metal structure may additionally be fabricated below or aligned to the alternate material 124. Unlike above, the metal contact below the alternate material 124 may serve as part of a crackstop features and may not conduct electricity to or from the TSV 112.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a substrate having a front side and a back side;
   semiconductor devices on said front side of said substrate;
   a through-substrate via extending through said substrate from said front side of said substrate to said back side of said substrate; and
   a backfill region adjacent to said through-substrate via and extending from said back side of said substrate to a depth within said substrate such that a portion of said substrate is between said backfill region and said through-substrate via,
   said depth of said backfill region being no more than approximately 50% of a thickness of said substrate,
   said portion of said substrate being in direct contact with and laterally surrounding a vertical sidewall of said through-substrate via,
   said backfill region comprising an alternate material having a lower modulus of elasticity than said substrate,
   said alternate material extending laterally between adjacent ones of said portion that laterally surround adjacent through-substrate vias,
   said alternate material being at least as thermally conductive as said substrate, and
   an exposed surface of said alternate material is essentially co-planar with said back side of said substrate.

2. The structure of claim 1, said alternate material comprising a polycrystalline material or an amorphous material.

3. The structure of claim 1,
   said portion of said substrate extending laterally from said vertical sidewall of said through-substrate via by a distance not less than a diameter or a width of said through-substrate via.

4. The structure of claim 1, further comprising:
   a metal contact on said back side of said substrate in direct contact with said through-substrate via.

5. A structure comprising:
   a substrate having a front side and a back side;
   semiconductor devices on said front side of said substrate;
   said substrate having said front side and said back side, said substrate comprising a dielectric material;
   a semiconductor device formed on said front side of said substrate; and
   a through-substrate via extending through said substrate from said back side of said substrate to said front side of said substrate, said through-substrate via contacting said semiconductor device,
   said substrate comprising a backfill region adjacent to said through-substrate via and extending from said back side of said substrate to a depth within said substrate, said depth being less than or equal to approximately 50% of a thickness of said substrate,
   a portion of said substrate being between said backfill region and said through-substrate via, said portion of said substrate being in direct contact with and laterally surrounding a vertical sidewall of said through-substrate via,
   said backfill region comprising an alternate material having a lower modulus of elasticity than said substrate,
   said alternate material extending laterally between adjacent ones of said portion that laterally surround adjacent through-substrate vias,
   said alternate material being at least as thermally conductive as said substrate, and
   an exposed surface of said alternate material is essentially co-planar with said back side of said substrate.

6. The structure of claim 5, said alternate material having a lower modulus of elasticity than said substrate.

7. The structure of claim 6, said alternate material comprising a polycrystalline material or an amorphous material.

8. The structure of claim 5,
   said through-substrate via having a height or a depth ranging from approximately 10 to approximately 50 times larger than its width.

9. The structure of claim 5,
   said portion of said substrate extending laterally from said vertical sidewall of said through-substrate via by a distance greater than or equal to a diameter or a width of said through-substrate via.

10. The structure of claim 5, said through-substrate via comprising a conductive material.

11. The structure of claim 5, said through-substrate via further comprising a barrier lining around said through-substrate via.

12. The structure of claim 5, further comprising:
    a metal contact on said back side of said substrate in direct contact with said through-substrate via.

13. A through-substrate via comprising:
    a substrate having a front side and a back side;
    semiconductor devices on said front side of said substrate;
    a conductive material extending from said back side of said substrate to said front side of said substrate, said substrate comprising a dielectric material;

a barrier lining surrounding said conductive material; and
a metal contact on said back side of said substrate in direct contact with said conductive material,
said substrate comprising a backfill region adjacent to said conductive material and extending from said back side of said substrate to a depth within said substrate, said depth being less than or equal to approximately 50% of a thickness of said substrate,
a portion of said substrate being between said backfill region and said conductive material and in direct contact with said conductive material,
said backfill region comprising an alternate material having a lower modulus of elasticity than said substrate,
said alternate material extending laterally between adjacent ones of said portion that laterally surround adjacent through-substrate vias,
said alternate material being at least as thermally conductive as said substrate, and
an exposed surface of the alternate material is essentially co-planar with said back side of the substrate.

14. The through-substrate via of claim 13, said alternate material having a lower modulus of elasticity than said substrate, and
said alternate material being at least as thermally conductive as said substrate.

15. The through-substrate via of claim 13,
said portion of said substrate extending laterally from a vertical sidewall of said conductive material by a distance greater than or equal to a diameter or a width of said conductive material.

16. The through-substrate via of claim 13, said conductive material having a cross sectional shape selected from the group consisting of:
annulus, rectangle, rounded rectangle, square, rounded square, and circle.

* * * * *